(12) United States Patent
Moogat et al.

(10) Patent No.: US 7,262,998 B2
(45) Date of Patent: Aug. 28, 2007

(54) NON-VOLATILE SYSTEM WITH PROGRAM TIME CONTROL

(75) Inventors: Farookh Moogat, Fremont, CA (US); Yan Li, Milpitas, CA (US); Alexander K. Mak, Los Altos, CA (US)

(73) Assignee: Sandisk Corporation, Milpitas, CA (US)

( * ) Notice: Subject to any disclaimer, the term of this patent is extended or adjusted under 35 U.S.C. 154(b) by 0 days.

(21) Appl. No.: 11/462,920

(22) Filed: Aug. 7, 2006

(65) Prior Publication Data

US 2006/0268618 A1 Nov. 30, 2006

Related U.S. Application Data

(63) Continuation of application No. 10/896,096, filed on Jul. 20, 2004, now Pat. No. 7,110,298.

(51) Int. Cl.
*G11C 16/04* (2006.01)
(52) U.S. Cl. .......................... 365/185.18; 365/185.19; 365/185.2
(58) Field of Classification Search ........... 365/185.18, 365/185.19, 185.2
See application file for complete search history.

(56) References Cited

U.S. PATENT DOCUMENTS 4,694,314 A 9/1987 Terada et al.
5,596,532 A 1/1997 Cernea et al.
5,991,201 A 11/1999 Kuo et al.

(Continued)

FOREIGN PATENT DOCUMENTS

WO  WO 96/41346  12/1996

OTHER PUBLICATIONS

Tanzawa et al., "A Stable Programming Pulse Generator for Single Power Supply Flash Memories", IEEE Journal of Solid-State Circuits, vol. 32, No. 6, Jun. 1997, pp. 845-851.

(Continued)

*Primary Examiner*—Huan Hoang
(74) *Attorney, Agent, or Firm*—Davis Wright Tremaine LLP

(57) ABSTRACT

In a non-volatile memory system, when it is discovered that the voltage pump pulse provided by a charge pump for programming the memory cells does not match a reference voltage, the programming time period of the voltage pump pulse is adjusted to a value that remains substantially unchanged until the end of the programming cycle. In this manner, the fluctuation in the effective programming time period of the programming pulses is prevented for the remainder of the programming cycle so that a broadening of the threshold voltage distribution will not occur or will be reduced. This feature allows a short programming time period to be designated for the programming pulses for enhanced performance, while allowing the flexibility of increased program time period when the charge pump is operating under conditions that causes it to be slow and/or weak.

16 Claims, 5 Drawing Sheets

U.S. PATENT DOCUMENTS

| | | | |
|---|---|---|---|
| 6,040,996 | A | 3/2000 | Kong |
| 6,088,266 | A | 7/2000 | Roohparvar |
| 6,128,223 | A | 10/2000 | Sasai et al. |
| 6,172,917 | B1 | 1/2001 | Kataoka et al. |
| 6,373,746 | B1 | 4/2002 | Takeuchi et al. |
| 6,522,580 | B2 | 2/2003 | Chen et al. |
| 6,556,465 | B2 | 4/2003 | Haeberli et al. |
| 6,560,152 | B1 | 5/2003 | Cernea |
| 6,882,567 | B1 | 4/2005 | Wong |
| 7,110,298 | B2 | 9/2006 | Moogat et al. |
| 2005/0157555 | A1* | 7/2005 | Ono et al. ............. 365/185.18 |

OTHER PUBLICATIONS

EPO/ISA, "Notification of Transmittal of the International Search Report and the Written Opinion of the International Searching Authority, or the Declaration", in corresponding PCT Application No. PCT/US2005/024701, mailed Nov. 16, 2005, 12 pages.

Miyamoto et al., "High-Reliability Programming Method Suitable for Flash Memories of More than 256 Mb", Extended Abstracts of the International Conference on Solid State Devices and Materials, Japan Society of Applied Physics, Tokyo, Japan, Aug. 21, 1995, pp. 67-69.

* cited by examiner

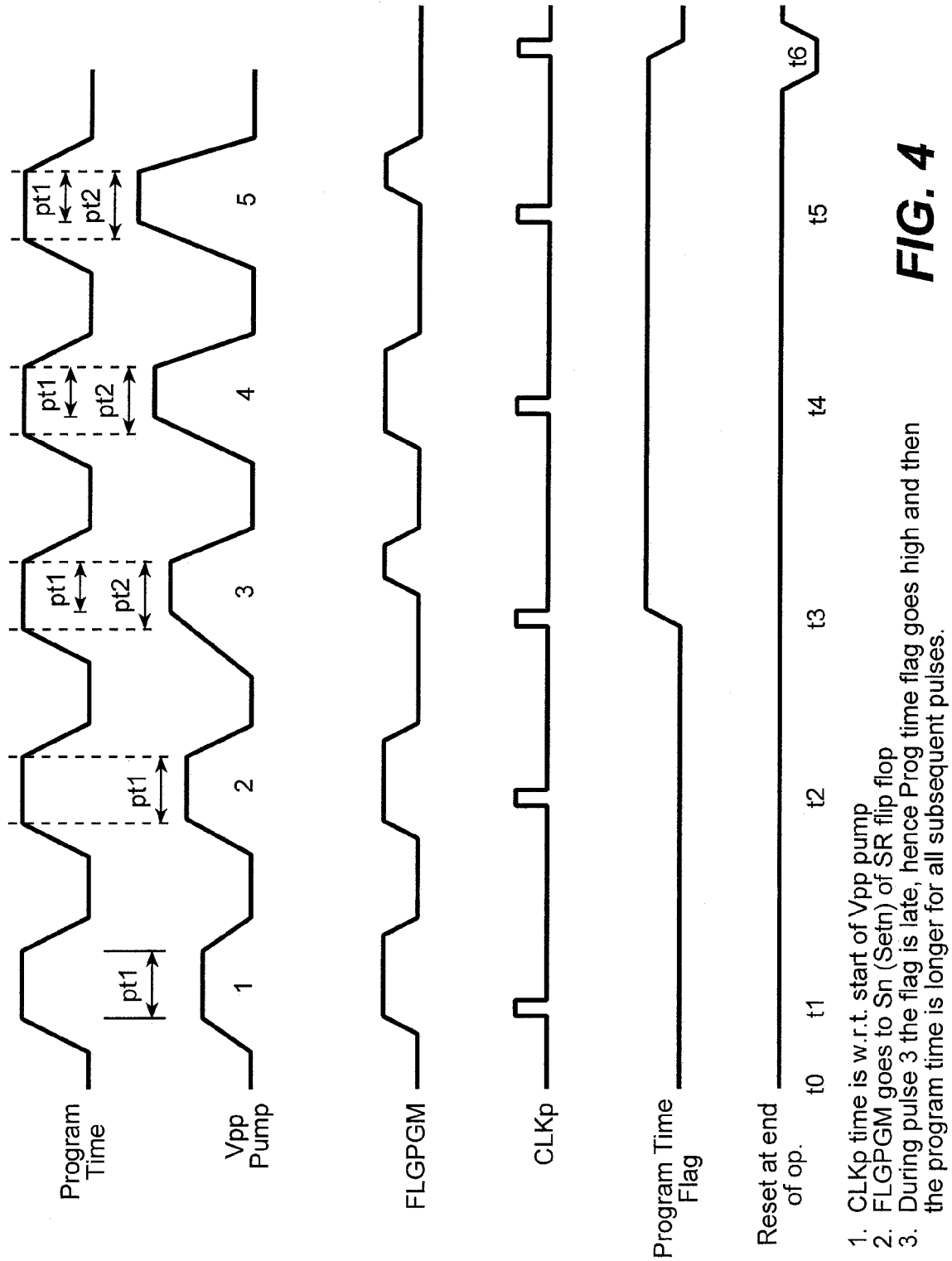

NON-VOLATILE SYSTEM WITH PROGRAM TIME CONTROL

CROSS-REFERENCE TO RELATED APPLICATION

This application is a continuation of application Ser. No. 10/896,096, filed Jul. 20, 2004, entitled "Non-Volatile System with Program Time Control," now U.S. Pat. No. 7,110,298, which application is incorporated in its entirety by reference as if fully set forth herein.

BACKGROUND OF THE INVENTION

This invention relates in general to non-volatile memory systems and, in particular, to a non-volatile memory system with programming time control.

The memory cells or charge storage elements (the two terms used herein interchangeably) of a non-volatile memory are typically programmed one partial or complete row of cells in parallel at a time. Programming voltage pulses are applied to the selected row of memory cells until the threshold voltage of each of the selected cells in the row has been programmed to a value within a predetermined voltage range (which may or may not be the final desired state of the cell) in a programming cycle. During each programming cycle, a time sequence of programming voltage pulses are applied at predetermined time intervals, such as periodic time intervals, where the amplitude of each programming pulse has been incremented by a fixed voltage step compared to the amplitude of the immediately preceding programming pulse in the sequence.

In time periods between the programming voltage pulses, program-verify operations are carried out. That is, the programmed level of each charge storage element being programmed in parallel is read after each programming pulse to determine whether it is not less than the verify voltage level to which it is being programmed. If it is determined that the threshold voltage of a given charge storage element has exceeded the verify voltage level, in a process referred to below as locking out, programming of such charge storage element is stopped by raising the voltage of the bit line to which the particular charge storage element is connected to from a low voltage (typically 0 volts) to a high or inhibit level (typically Vdd). Programming of other charge storage elements being programmed in parallel continues until they in turn reach their verify voltage levels. After each program verify operation, if there still is one or more charge storage elements being programmed in parallel whose threshold voltage still has not reached the verify voltage level, the amplitude of the programming pulse is increased by the predetermined step size and applied again to the charge storage elements being programmed in parallel, which is followed again by a program-verify operation. If after the next programming operation the increased programming pulse still has not caused the threshold voltage of all of the charged storage elements being programmed in parallel to reach the verify voltage level, the amplitude of the programming pulse is increased yet again by the same predetermined step size during the next time interval and this process is repeated until threshold voltages of all of the charge storage elements being programmed in parallel have reached the verify voltage level. This marks the end of a particular programming cycle.

In a floating gate charge storage element in which charge is introduced by Fowler-Nordheim tunneling, the amount of charge on the floating gate can be calculated as a function of the voltage pulse characteristics using well know tunneling equations. FIG. 5A shows the threshold voltage (measured from the control gate) as a function of the number of voltage pulses applied to the control gate. The various Fowler-Nordheim parameters used in this simulation were chosen to be typical of a 90 nm NAND process, and the voltage pulse was assumed to start at 15 volt and increase by 0.2 volts for every pulse. The two curves show that for two different pulse durations (10 μsec and 15 μsec), the slope of the threshold vs. voltage is nearly the same. The longer pulse duration produces an initially higher threshold voltage (more charge tunnels during the longer time) but the change in threshold with each pulse is proportional to the absolute value of the voltage. This means that as long as we use a fixed pulse duration for each programming step, we can expect that during each pulse the threshold will increase no more than a given amount (in this case 0.2 volts), and if we inhibit programming on a cell by cell basis as described above we expect the final threshold distribution of all cells programmed to a given logic state to be within a narrow range approximately equal to the voltage pulse step size.

The problem observed is that if the pulse duration is allowed to vary during a programming sequence, the width of that threshold distribution will be undesirably larger. FIG. 5B shows a simulation in which the first 4 pulses are applied at a constant program duration of 10 μsec with each pulse increasing by 0.2 volts, and then followed by a variable program pulse width. Series 1 shows the change in threshold voltage in the case that the $5^{th}$ and all subsequent pulses are 15 μsec. After another 5–10 pulses, the change in subsequent threshold voltage approaches that obtained previously with the narrower pulse, in accordance with the results shown in FIG. 5A. Note that even one longer pulse can increase the threshold of any cells locked out after that pulse such that they may exceed that expected if the pulse width did not increase. Series 2 shows the expected change in threshold voltage in the case where the pulse duration oscillates between 10 μsec and 15 μsec after each pulse: pulse 5 is 10 μsec and pulse 6 is 15 μsec, pulse 7 is 10 μsec and pulse 8 is 15 μsec and so forth. In this case the threshold distribution of the programmed state will be larger than that obtained by applying either 10 μsec or 15 μsec consistently, or that obtained from a one time change in pulse width. Although some pulses result in less than 0.2 volt threshold voltage change, that is not necessarily helpful because if that pulse fails to lockout but is right below the verify level, it will simply require one more pulse whose expected threshold change is larger resulting in a widened threshold distribution.

The above programming operation applies both to multi-level charge storage elements as well as binary-level charge storage elements or memory cells. An illustration of the above programming and program-verify operations to multi-level charge storage elements is described in U.S. Pat. No. 6,522,580, which is incorporated herein by reference in its entirety.

As will be evident from the above description, the above programming process requires repetitively programming the cells with a programming pulse followed by a program-verify operation. This process, therefore, can be time consuming. It is, therefore, desirable for the program time for the application of each programming pulse to have a short duration so that the memory cells or charge storage elements can be programmed to the desired threshold voltages in as short a time as possible for improved performance.

The programming pulses for programming the memory cells are often generated by charge pumps in which the output voltage is easily changed via DAC control. The voltage output of the charge pump is typically compared to a reference voltage. When the output of the charge pump reaches the value of the reference voltage, a program flag signal FLGPGM is generated to indicate that the pump output voltage has reached the desired program voltage level. The measurement of the programming time for the selected cells in the selected row will start as soon as the program flag FLGPGM is high. When this programming time starts, the programming voltage output (also called pump pulse) of the charge pump is applied to the memory cells or charge storage elements in parallel for altering their threshold voltages. In the event that the program flag FLGPGM is delayed, such as where the charge pump is weak as described below, programming will start at a predetermined time after the expected time of flag FLGPGM when the program flag FLGPGM has not yet arrived, resulting in a variable program duration from pulse to pulse.

When the program voltage level is increased by a certain step size voltage, the reference voltage is increased by the same step size and used for comparison with the programming pulse after it has been increased in step size. In this manner, the reference voltage that is used for generating the program flag FLGPGM will keep in step with the increasing program voltage level.

The strength of many charge pumps is a function of both temperature and input voltage level. At cold temperatures, for example, some types of charge pumps tend to be weak so that they require more time for the output voltage of the charge pump to reach a particular expected voltage value. Weak charge pumps may also take longer to provide a voltage output where a high amplitude voltage output is called for compared to where a low amplitude voltage output is required. Therefore, when the pump is weak so that the program flag FLGPGM is delayed, programming will start at periodic times even when the programming voltage pulse amplitude has not reached its intended or expected value. It is observed that under such circumstances, within a programming cycle, real programming is triggered sometimes by the arrival of the program flag FLGPGM, and sometimes at periodic times when the program flag FLGPGM is delayed. The effective programming time (the portion of the programming time period during which the programming pulse is at the desired voltage level) will therefore vary. This can cause a broadening of the threshold voltage distribution of the memory cells.

One solution is to increase the time allotted for the programming, so that even though at the beginning of the programming time period the voltage output of the charge pump has not yet reached the desired voltage level, the longer programming time period allocated for programming allows a weak charge pump to reach a desired voltage level after a certain time delay, so that the resulting effective programming time will still be adequate for programming the memory cells to the intended threshold voltage value. However, as noted above, for increased performance it would be desirable to minimize the programming time in which the programming pulses are applied. Therefore, allocating a longer programming time would degrade the performance of the non-volatile memory system. This is particularly the case since the longer programming time is needed only under certain limited conditions. It is, therefore, desirable to provide a non-volatile memory system, where the above-described difficulties are alleviated.

SUMMARY OF THE INVENTION

Ideally, it is desirable for the programming time period allocated to be as short as possible when the charge pump is strong, such as when the pump is operated at room temperature, and a longer programming time period will be preferred only when necessary to compensate for a slower charge pump. In the same vein, short programming time periods may be used during the beginning portion of the program cycle when the charge pump is called upon to supply low to moderate voltage outputs for the program pulses. Towards the end of the programming cycle, when high amplitude voltages are called for, longer programming time period may be used instead of the shorter time period used initially.

This invention is based on the recognition that when it is discovered that the voltage pump pulse provided by a charge pump does not match a reference voltage, the program time period of the voltage pump pulse is adjusted to a value that remains substantially unchanged until the end of the programming cycle. In this manner, the fluctuation in the effective programming time period of the programming pulses is prevented for the remainder of the programming cycle so that a broadening of the threshold voltage distribution will not occur or will be reduced. This feature allows a short programming time period to be designated for the programming pulses for enhanced performance, while allowing the flexibility of increased program time period when the charge pump is operating under conditions that cause it to be slow and/or weak.

BRIEF DESCRIPTION OF THE DRAWINGS

FIG. 4 is a timing diagram illustrating the operation of the circuit of FIG. 3.

For simplicity in description, identical components are labeled by the same numerals in this Application.

DESCRIPTION OF EXEMPLARY EMBODIMENTS

Figure 1:
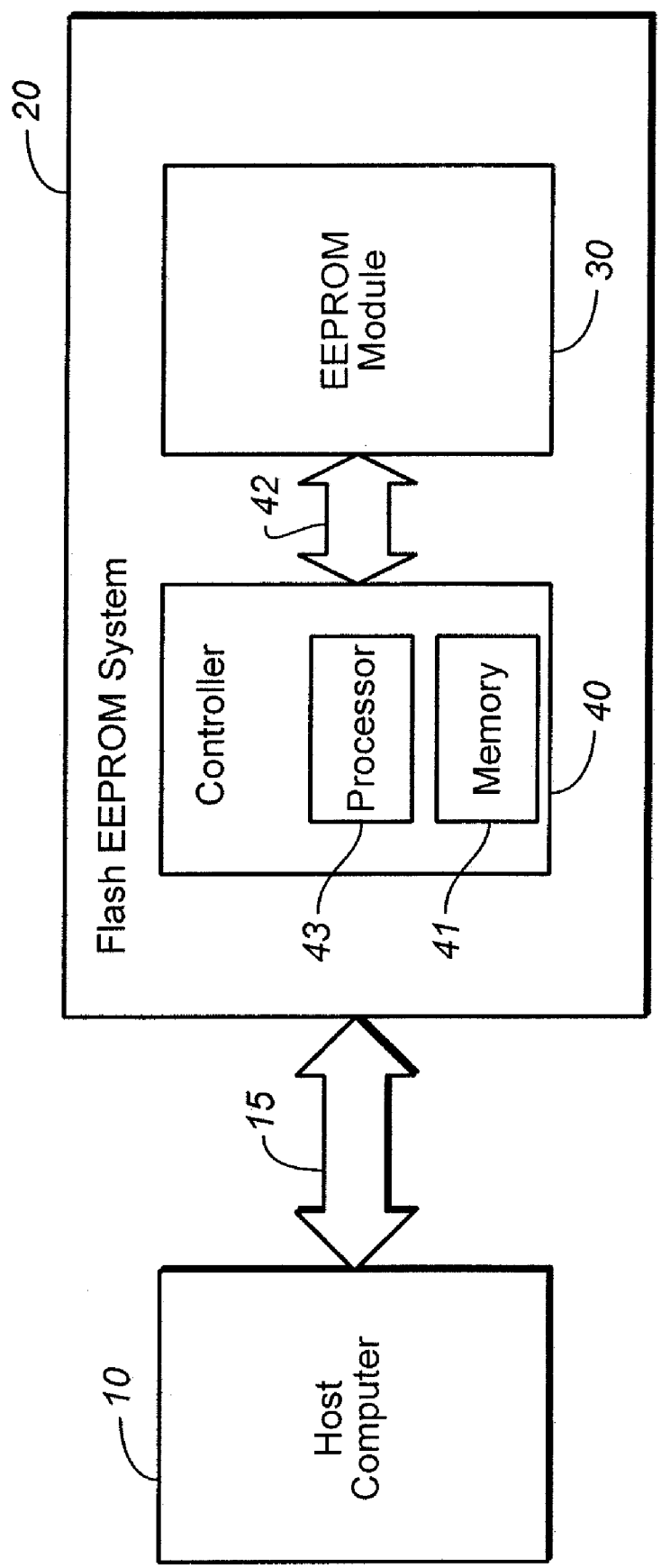
FIG. 1 illustrates a block diagram of a computer system including a host computer and a flash EEPROM system connected to the host computer.

FIG. 1 is a block diagram of a flash memory system 20 (which can be in the form of a plug-in card or module) in communication with a host computer 10 through system bus 15. The flash memory system 20 includes a flash EEPROM module 30 and a controller 40, which includes, in turn, memory 41 and a processor 43. Controller 40 interprets the commands received from the host computer 10 and translates them into corresponding read, write and other operations for the flash EEPROM module 30, in a manner transparent to the host computer 10.

Figure 2:
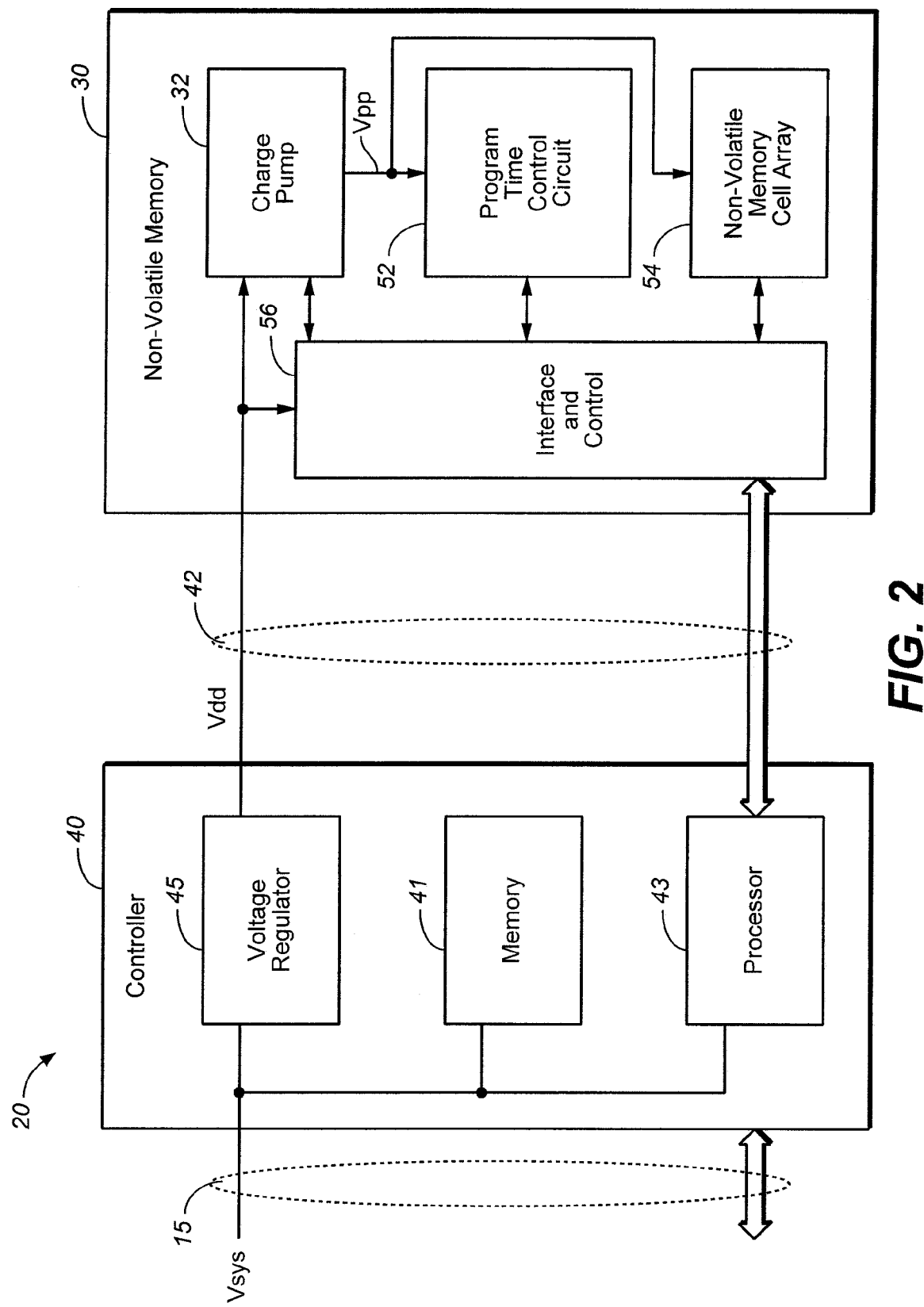
FIG. 2 is a block diagram of the controller and a voltage generation portion of the flash EEPROM system of FIG. 1 to illustrate one embodiment of the invention.

FIG. 2 illustrates, as an example, a simplified block diagram of portions of the flash EEPROM system 20 related to the generation of the charge pump voltage pulses. As shown in FIG. 2, the supply voltage Vsys is applied by the host to controller 40 and through an optional voltage regulator 45, a possibly different voltage level, Vdd, is applied to module 30. Processor 43 applies commands and timing signals to module 30 and the charge pump 32 generates the programming pulses Vpp from the voltage Vdd in response to the control signals from processor 43. In practice there is usually sufficient logic in the Interface and Control module 56 in the non-volatile memory 30 to control the detailed operation of the memory, relieving Processor 43 from this responsibility. Typically Control 56 consists of sufficient logic to interpret commands from Processor 43 using a pre-defined protocol, and a dedicated logic state machine, possibly with some parameters stored in a separate ROM within Control 56 or Array 54 and read out upon startup. However, the present invention does not depend on the physical location of the controller and either Processor 43 or Interface and Control 56 may be used. The programming pulses Vpp are applied to program time control circuit 52 and to a memory cell array 54. Array 54 comprises rows and columns of memory cells. For simplicity in description, the various control circuits for row and column control, as well as other controls, for the memory array have been omitted from FIG. 2. The program time control circuit 52 detects when the amplitude of the programming pulse Vpp is lower than the reference voltage. When this happens, circuit 52 sets a programming time flag and sends the flag to Control 56. Control 56, in turn, increases the programming time of the subsequent pulses Vpp generated by the charge pump 32. Circuit 52 is such that, in the time sequence of programming pulses Vpp, upon encountering the first instance when Vpp falls below the corresponding reference voltage (which increases stepwise to keep up with the step size voltage increase of the programming pulse Vpp), the programming time flag is set for the remainder of the programming cycle so that the increased programming time will be employed for all of the subsequent programming pulses Vpp generated during the remainder of the programming cycle.

Figure 3:
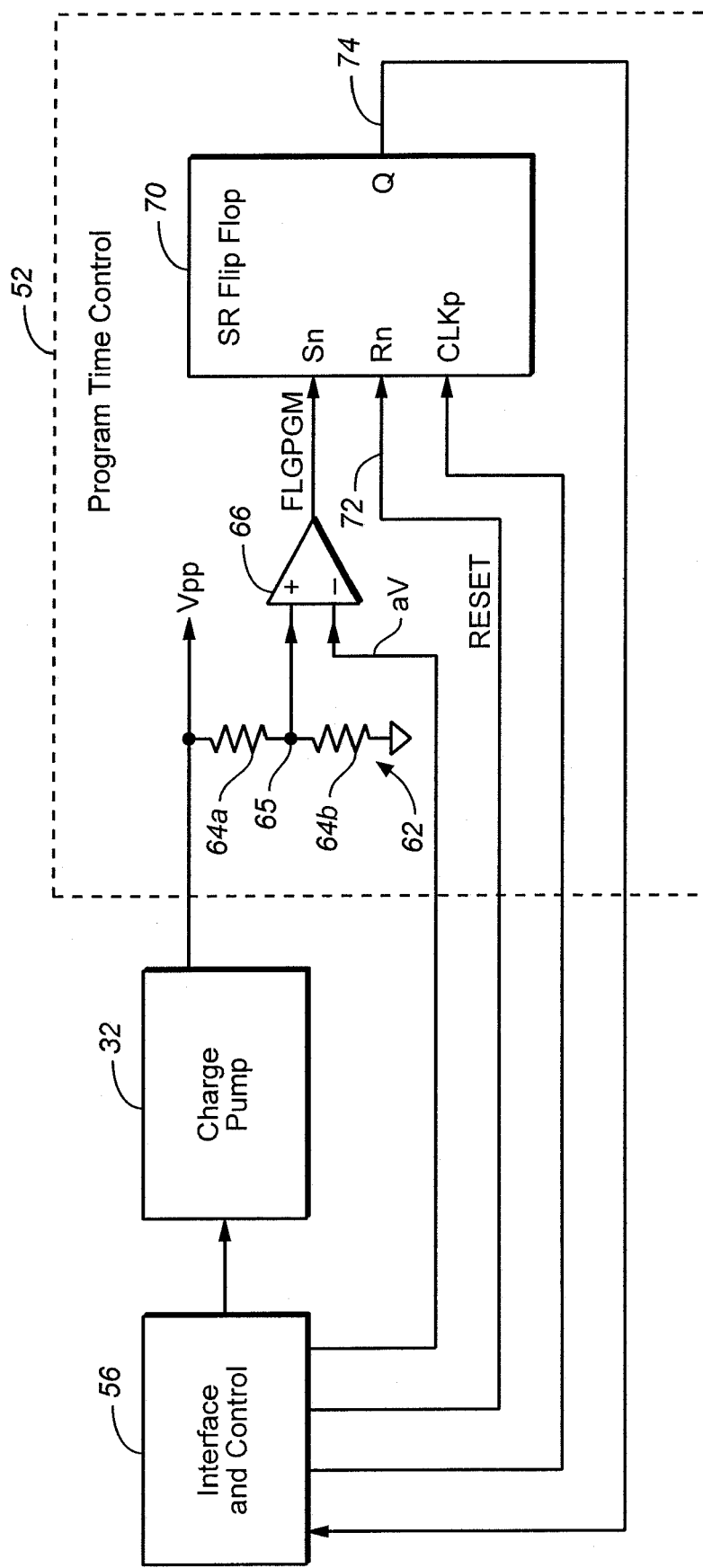
FIG. 3 is a schematic circuit diagram of some of the elements of the circuit in FIG. 2 to illustrate an embodiment of the invention.
Figure 5A:
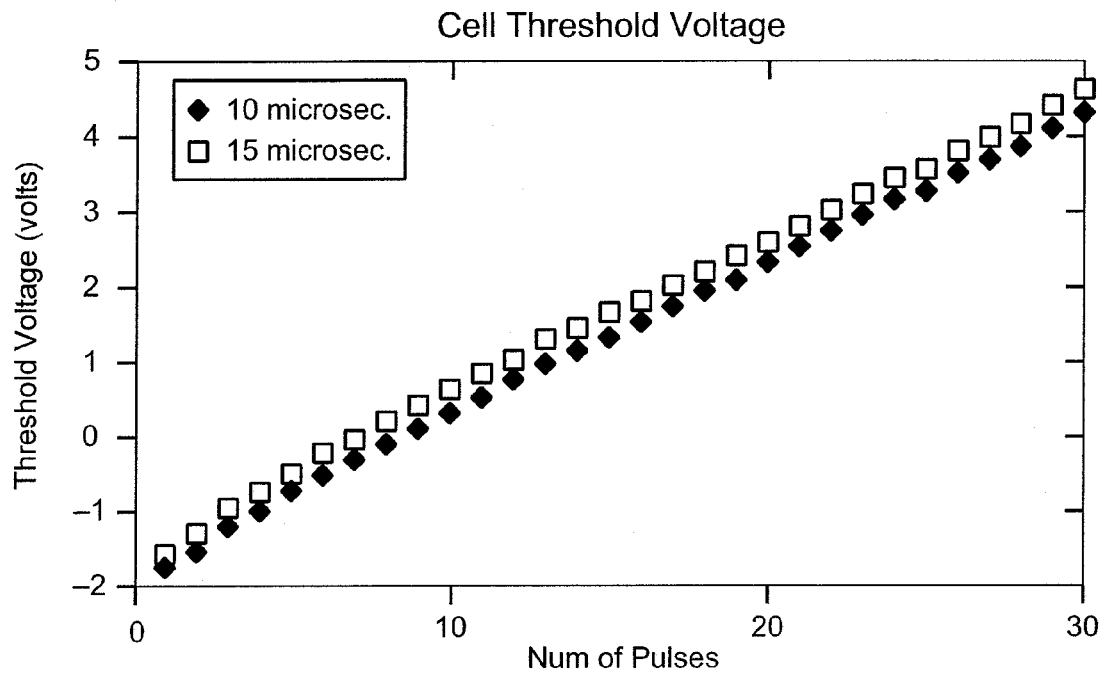
FIG. 5A is a computer simulation of cell threshold voltage as a function of the number of pulses applied to the charge storage cell for two different pulse durations.
Figure 5B:
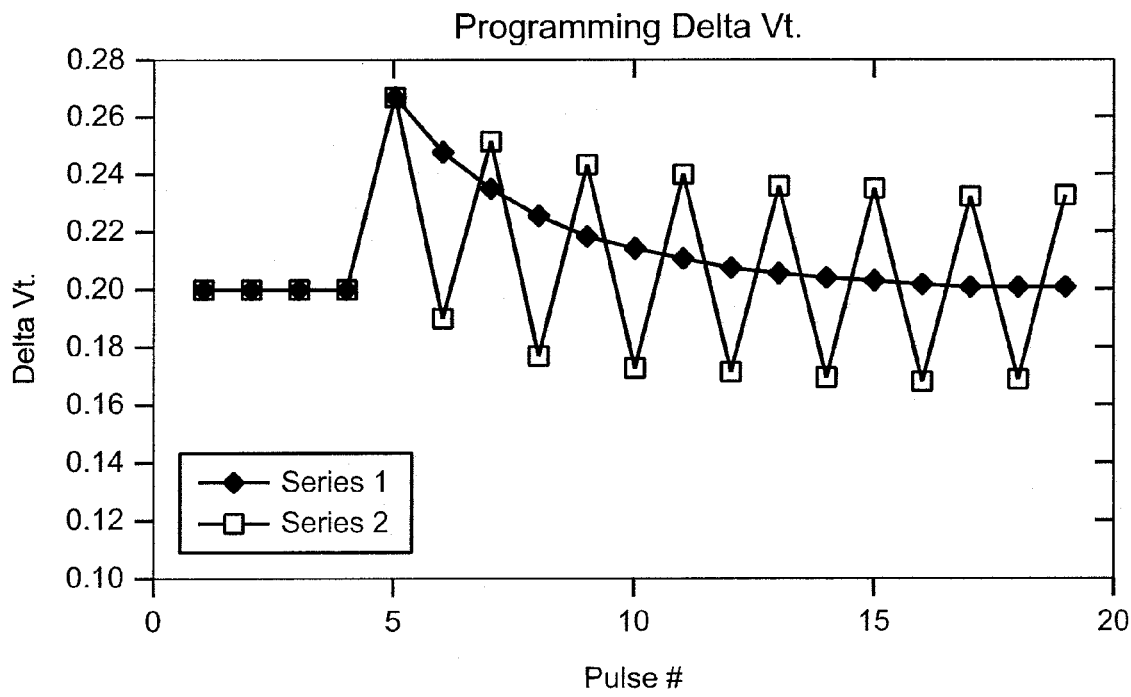
FIG. 5B is a computer simulation of the change in cell threshold voltage as a function of the number of pulses applied to the charge storage cell for two different pulse duration sequences.

FIG. 3 is a schematic circuit diagram showing in more detail the program time control circuit 52 of FIG. 2. As shown in FIG. 3, the output Vpp of charge pump 32 is connected to a voltage divider 62 comprising two resistors 64a, 64b connected at node 65. The resistor 64b is also connected to ground. Node 65 is connected to one of the inputs of comparator 66 whose other input receives a voltage aV from Control 56, where V is the reference voltage. Comparator 66 compares the voltage at node 65 to the voltage aV. The value of a has been adjusted to account for the fall in voltage from Vpp across resister 64a, in order that the comparison between the voltage at node 65 and aV by comparator 66 will indicate whether Vpp is above or below reference voltage V. Thus, when the voltage output Vpp of charge pump 32 is above V, comparator 66 will set the value of the flag signal FLGPGM high (i.e. "1"). The flag signal FLGPGM is applied to the Sn input of the SR flip flop 70. The input Sn of flip flop 70 is "active low," which means that the Sn input of flip flop 70 responds to the signal which is inverted from flag signal FLGPGM at the input Sn. The input Rn of flip flop 70 is also "active low." Flip flop 70 will be set when Vpp is below the reference voltage at the time when CLKp is activated.

FIG. 4 is a timing diagram illustrating the operation of the circuit of FIG. 3, where the time t0 indicates the beginning of a programming cycle. The SR flip flop 70 is a clocked flip flop, so that it responds to the signals at the inputs Sn and Rn when the clock pulse CLKp from Control 56 is active (e.g. high). As illustrated in FIG. 4, near the beginning t0 of a programming cycle, charge pump 32 is caused by Control 56 to provide the first pump pulse labeled 1, and the initial default programming time period is set to a smaller value pt1 (e.g. about 11 or 12 µs) to optimize performance of system 20 shown in FIG. 2. As shown in FIG. 4, the programming or program time pt1 is substantially the same as the pulse width of the first pump pulse labeled 1. The amplitude of this pump pulse is compared to the reference voltage supplied by Control 56 in the manner described above.

Initially (i.e. at time t0) the program time flag is set at low or "0." Assuming that the amplitude of Vpp of the first programming pulse 1 is higher than that of the reference voltage, the flag signal FLGPGM is asserted high before time t1 as shown in FIG. 4. Flip flop 70 then receives the first clock pulse CLKp at time t1 from Control 56. As shown in FIG. 4, the reset at end of operation signal 72 from Control 56 applied to the input Rn of flip flop 70 is asserted high at the beginning t0 of a programming cycle. Therefore, at time t1 when a first clock pulse (CLKp) is applied to the flip flop, both inputs Sn and Rn are high. Since the flip flop responds to the inverted signals of the flag signal FLGPGM and of the reset signal at the end of operation, this indicates that the Q output of flip flop 70 should be held at its initial value set upon the start of the programming cycle, or at low or "0." At time t2 when a second clock pulse (CLKp) is applied to the flip flop 70, the same process is repeated. Prior to time t2, the programming pulse Vpp is higher than the reference voltage so that the flag signal is again asserted high and the Q output of the flip flop is held low again.

At time t3, however, the output programming pulse Vpp of charge pump 32 rises slower than before, so that the desired peak amplitude is not reached until a time later than t3. This can be due to a number of different causes, one of which is low temperature. Another possible cause is the fact that the charge pump 32 is called upon to supply a higher voltage level at time t3 than earlier times. Since the input to Sn is low, flip flop 70 resets its output at Q to high at time t3. This is the program time flag signal, which is supplied to Control 56, which in turn increases the program or programming time immediately from pt1 to pt2, and will so alter the control signals it applies to the EEPROM module 30 to reflect this change in programming time. This will allow sufficient time for the pump pulse to rise to the expected peak amplitude and still allow the pump pulse to be applied at this peak amplitude for the desired programming time pt1, as indicated in FIG. 4. Ideally, the value of pt2 is set so that it is longer than pt1 by an amount just enough to allow for the slower rise time of the pump pulse, so as to not unnecessarily degrade performance, even when the pump is weaker. In the example above where pt1 is about 11 or 12 µs, pt2 may have the value of about 14 µs.

The Q output 74 of flip flop 70, or the program time flag signal, remains unchanged for the remainder of the programming cycle, so that processor 43 and/or Control 56 continues to control module 30 so that this increased programming time pt2 is used instead of pt1 for the remainder of the programming cycle. Therefore, the programming time allocated for the next pump pulse Vpp is pt2 rather than pt1 as shown in FIG. 4. Even where the amplitude of the programming pulse exceeds the reference voltage at time t4 for any reason, so that the flag signal FLGPGM is high, as is the case at time t4 shown in FIG. 4, the programming time allocated for the pump pulse Vpp remains to be pt2. At the end of the programming cycle at time t6, the reset at end of operation signal falls low to "0". As known to those skilled in the art, the SR flip flop can be designed so that the reset input at Rn has a higher priority than the set input Sn. Thus, at the arrival of the clock signal at time t6, the flip flop 70 resets its Q output to low or "0." This causes Control 56 to return the program time to the smaller default value pt1, ready for the next program cycle.

While the invention has been described above by reference to various embodiments, it will be understood that changes and modifications may be made without departing from the scope of the invention, which is to be defined only by the appended claims and their equivalent. All references referred to herein are incorporated by reference.

What is claimed is:

1. A non-volatile memory system comprising:
   a plurality of charge storage elements;
   a charge pump providing sequentially voltage pump pulses where the amplitude of each of at least some of the pulses increases relative to a prior pulse during a programming cycle for programming said plurality of charge storage elements;
   a comparator having a first input receiving said sequence of voltage pump pulses, a second input receiving a reference voltage whose amplitude increases at predetermined time intervals, and an output providing an output signal indicative of a comparison of said voltage pump pulse to said reference voltage; and
   a circuit that generates a program time control signal in response to the output signal, said program time control signal causing a program time allocated for application of the voltage pump pulse to the charge storage elements to be adjusted to a value that remains substantially unchanged until end of the programming cycle when the voltage pump pulse amplitude does not match said reference voltage.

2. The system of claim 1, the circuit comprising a latch that stores said program time control signal.

3. The system of claim 2, wherein the latch is resettable at the end of the programming cycle.

4. The system of claim 2, further comprising a controller that controls the program time of the voltage pump pulse provided by the charge pump, wherein said controller resets the latch at the end of the programming cycle.

5. The system of claim 2, wherein the latch comprises a SR flip flop.

6. The system of claim 1, further comprising a controller that supplies the reference voltage to the comparator.

7. The system of claim 6, wherein the controller controls program time of the voltage pump pulse provided by the charge pump.

8. The system of claim 1, said program time control signal causing a pulse width of the voltage pump pulse provided to be increased to a predetermined value that remains substantially unchanged until end of the programming cycle.

9. The system of claim 1, wherein the program time is set at a first value, and said program time control signal causes the program time to be increased to a second value higher than the first value.

10. The system of claim 1, wherein said program time control signal causes a program time allocated for application of the voltage pump pulse to the charge storage elements to be adjusted to a value that remains substantially unchanged until end of the programming cycle when the voltage pump pulse amplitude is below said reference voltage.

11. A method for programming non-volatile memory system, said system comprising a plurality of charge storage elements; said method comprising:
    providing sequentially voltage pump pulses where the amplitude of each of at least some of the pulses increases relative to a prior pulse during a programming cycle for programming said plurality of charge storage elements;
    comparing said sequence of voltage pump pulses to a reference voltage whose amplitude increases at predetermined time intervals, and providing an output signal indicative of a comparison of said voltage pump pulse to said reference voltage; and
    generating a program time control signal in response to the output signal, said program time control signal causing a program time of the voltage pump pulse provided to be adjusted to a value that remains substantially unchanged until end of the programming cycle when the voltage pump pulse amplitude does not match said reference voltage.

12. The method of claim 11, further comprising storing said program time control signal.

13. The method of claim 11, further comprising resetting program time of the voltage pump pulse at the end of the programming cycle.

14. The method of claim 11, said program time control signal causing the program time of the voltage pump pulse provided to be increased to a predetermined value that remains substantially unchanged until end of the programming cycle.

15. The method of claim 11, further comprising setting the program time to an initial first value, wherein said program time control signal causes the program time to be increased to a second value higher than the first value.

16. The method of claim 11, wherein said program time control signal causes a program time allocated for application of the voltage pump pulse to the charge storage elements to be adjusted to a value that remains substantially unchanged until end of the programming cycle when the voltage pump pulse amplitude is below said reference voltage.

* * * * *

UNITED STATES PATENT AND TRADEMARK OFFICE
CERTIFICATE OF CORRECTION

PATENT NO. : 7,262,998 B2  Page 1 of 1
APPLICATION NO. : 11/462920
DATED : August 28, 2007
INVENTOR(S) : Farookh Moogat, Yan Li and Alexander K. Mak It is certified that error appears in the above-identified patent and that said Letters Patent is hereby corrected as shown below:

Column 7, line 52, claim 8; after "voltage pump" delete "pulse" and insert --pulses--.

Signed and Sealed this

Eighteenth Day of December, 2007

JON W. DUDAS
*Director of the United States Patent and Trademark Office*